(12) United States Patent
Warshavsky et al.

(10) Patent No.: US 10,127,335 B2
(45) Date of Patent: *Nov. 13, 2018

(54) SYSTEM AND METHOD OF PERFORMING ANALYTICS WITH RESPECT TO CONTENT STORING SERVERS CACHING POPULAR CONTENT

(71) Applicant: Qwilt, Inc., Redwood City, CA (US)

(72) Inventors: Arnon Warshavsky, Ben Ammi (IL); Oren Shemesh, Moledet (IL); Gaash Hazan, Kfra Saba (IL); Yoav Gressel, Netaim (IL); Dan Sahar, San Francisco, CA (US); Alon Maor, Palo Alto, CA (US)

(73) Assignee: Qwilt, Inc, Redwood City, CA (US)

( * ) Notice: Subject to any disclaimer, the term of this patent is extended or adjusted under 35 U.S.C. 154(b) by 525 days.

This patent is subject to a terminal disclaimer.

(21) Appl. No.: 14/665,884

(22) Filed: Mar. 23, 2015

(65) Prior Publication Data

US 2015/0193567 A1      Jul. 9, 2015

Related U.S. Application Data

(63) Continuation-in-part of application No. 13/006,785, filed on Jan. 14, 2011, now Pat. No. 9,723,073.

(Continued)

(51) Int. Cl.
*G06F 17/50* (2006.01)
*H04L 12/26* (2006.01)
(Continued)

(52) U.S. Cl.
CPC .... *G06F 17/5009* (2013.01); *H04L 29/08729* (2013.01); *H04L 43/062* (2013.01);
(Continued)

(58) Field of Classification Search
CPC ......... H04L 29/08729; H04L 29/08774; H04L 29/0881; H04L 29/08891; H04L 67/1095;
(Continued)

(56) References Cited

U.S. PATENT DOCUMENTS 5,829,046 A    10/1998  Tzelnic et al.
5,893,140 A     4/1999  Vahalia et al.
(Continued)

OTHER PUBLICATIONS

Non-Final Office Action dated Sep. 25, 2012 for U.S. Appl. No. 13/006,785.
(Continued)

*Primary Examiner* — Davoud A Zand
(74) *Attorney, Agent, or Firm* — M&B IP Analysts, LLC

(57) ABSTRACT

Methods and systems are provided for generating a traffic simulation respective of at least one content storing server, the content storing server operative for caching popular content. One method includes sniffing traffic between at least a first portion of a network and at least a second portion of the network, identifying, from the sniffed traffic, at least a source of content and at least a destination of the content, determining if the content is stored on a cache, simulating a notification respective of the content, and generating a simulation of traffic respective at least of: the content and the simulated notification.

8 Claims, 7 Drawing Sheets

Related U.S. Application Data

(60) Provisional application No. 61/969,418, filed on Mar. 24, 2014, provisional application No. 61/375,836, filed on Aug. 22, 2010.

(51) Int. Cl.
  *H04L 29/08* (2006.01)
  *H04L 29/06* (2006.01)

(52) U.S. Cl.
  CPC .......... *H04L 67/06* (2013.01); *H04L 67/1095* (2013.01); *H04L 67/2842* (2013.01); *H04L 67/38* (2013.01)

(58) Field of Classification Search
  CPC ............. H04L 67/1097; H04L 67/2847; H04L 67/2842; H04L 67/2852; H04L 67/06; H04L 67/38; H04L 43/062; G06F 17/5009
  USPC .......... 709/223, 224; 340/1.1–16.1; 370/252; 714/39, 47.1–47.3
  See application file for complete search history.

(56) References Cited

U.S. PATENT DOCUMENTS

| | | | |
|---|---|---|---|
| 5,933,603 A | 8/1999 | Vahalia et al. | |
| 5,944,789 A | 8/1999 | Tzelnic et al. | |
| 5,948,062 A | 9/1999 | Tzelnic et al. | |
| 6,049,530 A | 4/2000 | Petersen et al. | |
| 6,061,504 A | 5/2000 | Tzelnic et al. | |
| 6,363,413 B2 | 3/2002 | Kidder | |
| 6,473,794 B1* | 10/2002 | Guheen | H04L 41/22 709/223 |
| 6,536,037 B1* | 3/2003 | Guheen | G06F 8/71 703/2 |
| 6,615,166 B1* | 9/2003 | Guheen | G06Q 10/06 703/26 |
| 6,700,889 B1 | 3/2004 | Nun | |
| 6,772,193 B1 | 8/2004 | Igawa et al. | |
| 6,799,248 B2 | 9/2004 | Scherr | |
| 6,823,401 B2* | 11/2004 | Feather, Jr. | H04L 29/06 710/15 |
| 6,831,893 B1 | 12/2004 | Ben-Nun et al. | |
| 6,873,600 B1* | 3/2005 | Duffield | H04L 12/2697 370/252 |
| 6,985,956 B2* | 1/2006 | Luke | G06F 11/2089 709/216 |
| 6,986,018 B2 | 1/2006 | O'Rourke et al. | |
| 7,149,698 B2* | 12/2006 | Guheen | G06Q 50/01 705/319 |
| 7,281,260 B2 | 10/2007 | Puente et al. | |
| 7,310,480 B2 | 12/2007 | Maciocco et al. | |
| 7,349,979 B1* | 3/2008 | Cieslak | H04L 67/2814 709/238 |
| 7,436,830 B2 | 10/2008 | Ben-Nun et al. | |
| 7,596,664 B2 | 9/2009 | Ishikawa et al. | |
| 7,606,314 B2 | 10/2009 | Coleman et al. | |
| 7,685,254 B2 | 3/2010 | Pandya | |
| 7,697,557 B2 | 4/2010 | Segel | |
| 7,719,966 B2 | 5/2010 | Luft et al. | |
| 7,818,402 B1 | 10/2010 | Zhang | |
| 7,912,921 B2 | 3/2011 | O'Rourke et al. | |
| 7,957,396 B1 | 6/2011 | Kohn et al. | |
| 8,009,682 B2* | 8/2011 | Gopinath | G06F 9/5005 370/252 |
| 8,065,559 B2 | 11/2011 | Kamath et al. | |
| 8,607,166 B2 | 12/2013 | Jalon et al. | |
| 8,621,101 B1* | 12/2013 | Starr | H04L 67/28 709/223 |
| 8,706,900 B2 | 4/2014 | Carver et al. | |
| 8,737,407 B2* | 5/2014 | Shetty | G06F 9/505 370/395.2 |
| 8,937,942 B1* | 1/2015 | Li | H04L 67/1097 370/386 |
| 2001/0049732 A1 | 12/2001 | Raciborski et al. | |
| 2001/0051980 A1 | 12/2001 | Raciborski et al. | |
| 2002/0006124 A1 | 1/2002 | Jimenez et al. | |
| 2002/0040366 A1 | 4/2002 | Lahr | |
| 2002/0040404 A1 | 4/2002 | Lahr | |
| 2002/0042817 A1 | 4/2002 | Lahr | |
| 2002/0048269 A1 | 4/2002 | Hong et al. | |
| 2002/0062372 A1 | 5/2002 | Hong et al. | |
| 2002/0136204 A1 | 9/2002 | Chen et al. | |
| 2003/0097443 A1 | 5/2003 | Gillett et al. | |
| 2003/0221127 A1 | 11/2003 | Risan et al. | |
| 2004/0128693 A1 | 7/2004 | Weigand | |
| 2004/0133776 A1 | 7/2004 | Putzolu | |
| 2004/0181579 A1 | 9/2004 | Huck et al. | |
| 2005/0015702 A1* | 1/2005 | Shier | G06F 11/2273 714/776 |
| 2005/0022237 A1 | 1/2005 | Nomura | |
| 2005/0213514 A1* | 9/2005 | Su | H04L 41/142 370/254 |
| 2005/0289111 A1 | 12/2005 | Tribble et al. | |
| 2006/0129697 A1 | 6/2006 | Vange et al. | |
| 2006/0168318 A1 | 7/2006 | Twiss | |
| 2006/0224687 A1 | 10/2006 | Popkin et al. | |
| 2006/0271972 A1 | 11/2006 | Pai et al. | |
| 2007/0050686 A1* | 3/2007 | Keeton | G06F 11/261 714/48 |
| 2007/0124781 A1 | 5/2007 | Casey et al. | |
| 2007/0192474 A1 | 8/2007 | Decasper et al. | |
| 2007/0244987 A1 | 10/2007 | Pedersen et al. | |
| 2008/0010381 A1 | 1/2008 | Barraclough et al. | |
| 2008/0307343 A1 | 12/2008 | Robert et al. | |
| 2009/0083279 A1 | 3/2009 | Hasek | |
| 2009/0119734 A1 | 5/2009 | Deshpande et al. | |
| 2009/0172565 A1 | 7/2009 | Jackson et al. | |
| 2009/0193129 A1 | 7/2009 | Agarwal et al. | |
| 2009/0307757 A1 | 12/2009 | Groten | |
| 2009/0313437 A1 | 12/2009 | Sofman et al. | |
| 2010/0023726 A1* | 1/2010 | Aviles | G06F 12/0813 711/216 |
| 2010/0054257 A1 | 3/2010 | Dolganow et al. | |
| 2010/0082774 A1 | 4/2010 | Pitts | |
| 2010/0115072 A1 | 5/2010 | Payyappilly et al. | |
| 2010/0287227 A1* | 11/2010 | Goel | H04L 67/1002 709/202 |
| 2011/0055386 A1 | 3/2011 | Middleton et al. | |
| 2011/0078343 A1 | 3/2011 | Resch et al. | |
| 2011/0107185 A1 | 5/2011 | Grube et al. | |
| 2011/0141887 A1 | 6/2011 | Klein et al. | |
| 2011/0153937 A1 | 6/2011 | Annamalaisami et al. | |
| 2012/0011271 A1* | 1/2012 | Zhao | H04W 4/18 709/234 |
| 2012/0030212 A1 | 2/2012 | Koopmans et al. | |
| 2012/0047224 A1 | 2/2012 | Shemesh et al. | |
| 2012/0047252 A1 | 2/2012 | Maor et al. | |
| 2012/0057460 A1 | 3/2012 | Hussain et al. | |
| 2012/0084464 A1 | 4/2012 | Cochinwala et al. | |
| 2012/0117610 A1 | 5/2012 | Pandya | |
| 2012/0124618 A1 | 5/2012 | Ruiz-Velasco et al. | |
| 2012/0159329 A1 | 6/2012 | Chow et al. | |
| 2012/0159558 A1 | 6/2012 | Whyte et al. | |
| 2014/0108586 A1 | 4/2014 | Zhao | |
| 2016/0021057 A1 | 1/2016 | Frost et al. | |

OTHER PUBLICATIONS

Non-Final Office Action dated Jul. 26, 2012 in U.S. Appl. No. 13/006,875.

\* cited by examiner

SYSTEM AND METHOD OF PERFORMING ANALYTICS WITH RESPECT TO CONTENT STORING SERVERS CACHING POPULAR CONTENT

CROSS-REFERENCE TO RELATED APPLICATION

This application claims priority from U.S. provisional patent application No. 61/969,418 filed Mar. 24, 2014 and is a continuation-in-part of U.S. patent application Ser. No. 13/006,785 filed Jan. 14, 2011, entitled "A System for Detection of Content Servers and Caching Popular Content Therein", which claims priority from U.S. provisional patent application No. 61/375,836, entitled "A System for Detection of Content Servers and Caching Popular Content Therein", filed on Aug. 22, 2010, all of the above-noted applications being assigned to a common assignee and all of the above-noted applications are hereby incorporated by reference in their entirety.

BACKGROUND

1. Technical Field

The present disclosure generally relates to classification of packets transmitted over a network and particularly to the determination of content to be stored in storage located along the network based on the type of data transferred in the packet. Even more particularly, the present disclosure relates to traffic analytics respective of the data and generation of a simulation respective of the analysis.

2. Description of the Related Art

Service providers worldwide are facing a mounting problem of flattening revenues coupled with increasing costs brought forth by increasing usage of bandwidth, growing churn, subscriber saturation and competitive price pressures. These mobile and broadband providers are facing challenges in delivering new revenue generating services while seeing their over the top (OTT) counterparts reaping rewards with content delivered over the networks they built and maintained over the years.

The vast majority of these OTT services are delivered over hypertext transfer protocol (HTTP), the de-facto protocol for application development and delivery. Be it video, social networking, search, or advertising, and be it over fixed line or mobile applications, these OTT services are most likely running on top of HTTP. However, this protocol is also the most processing intensive protocol for network devices. Hence, practically any increase in usage increases the strain on the service providers.

Certainly, one way to control traffic on the Internet requires various levels of understanding of the traffic that flows through the network, and that understanding is also increasing in its level of sophistication. Various systems and solutions have been offered in the related art that utilize deep-packet-inspection (DPI) to enable an ever sophisticated examination of network traffic and ability to shape the traffic on the network. This ability allows the service providers to better manage the network and its related resources and provide a higher level of quality of service (QoS) in the hopes of increasing revenues and profits.

SUMMARY

However, the rapid increase in the delivery of heavy bandwidth consuming data, such as video, and consumption thereof, requires a new level of handling that is not available today in related art solutions. A known problem is the access of a user to a content source and subsequently the access by another user to the same content, resulting in additional load on the content provider and on the entire network. When, for example, popular video clips are accessed, there is a significant and noticeable degradation of network performance which may even lead to a network failure. Some related art solutions attempt to store all the data in caches. However, the huge amounts of data and the need to inspect each and every packet, regardless of its source, makes this a daunting and impractical task.

It would be advantageous to provide service providers with a solution that would enable them to effectively manage and control the delivery of heavy bandwidth consuming data such that the overall bandwidth requirements are loaded and better shared across the network in general, and in particular within the network of a specific service provider. It would be further advantageous to provide a system and method for performing traffic analytics that determines the effect such a solution provides or could provide.

Accordingly, one or more exemplary embodiments provide a solution that effectively manages and controls the delivery of heavy bandwidth consuming data such that the overall bandwidth requirements are loaded and better shared across the network, particularly within the network of a specific service provider. Further, techniques are provided for performing traffic analytics that determine the effect such a solution provides or could provide.

The foregoing and/or other aspects of the exemplary embodiments may be achieved by a computerized method of generating a traffic simulation respective of at least one content storing server for caching popular content. This method may include sniffing traffic between at least a first portion of a network and at least a second portion of the network, identifying, from the sniffed traffic, at least a source of content and at least a destination of the content, determining if the content is stored on a cache, simulating a notification respective of the content, and generating a simulation of traffic respective at least of: the content and the simulated notification.

The computerized method may further include determining, upon determining that the content is not stored on the cache, if the content should be acquired to be stored on the cache.

The computerized method may further include simulating, upon determining that the content should be acquired, a "store" notification respective of the content.

The computerized method may further include simulating, upon determining that the content should not be acquired, a "no deliver" notification respective of the content.

The computerized method may further include determining, upon determining that the content is stored on the cache, if the content can be delivered from the cache.

The computerized method may further include simulating, upon determining that the content can be delivered from the cache, a "potential delivery" notification respective of the content.

The computerized method may further include simulating, upon determining that the content cannot be delivered from the cache, a "no deliver" notification respective of the content.

The identifying may be performed by a deep-packet-inspection (DPI) unit.

The computerized method may further include receiving a size of the cache for storing the content, wherein the generating may further include generating the simulation of traffic respective of the cache size.

The computerized method may further include determining, upon determining that the content is not stored on the cache, if the content should be acquired to be stored on the cache.

The computerized method may further include generating, upon determining that the content should be acquired, a "store" notification respective of the content.

The computerized method may further include generating, upon determining that the content should not be acquired, a "no deliver" notification respective of the content.

The computerized method may further include determining, upon determining that the content is stored on the cache, if the content can be delivered from the cache.

The computerized method may further include generating, upon determining that the content can be delivered from the cache, a "potential delivery" notification respective of the content.

The computerized method may further include generating, upon determining that the content cannot be delivered from the cache, a "no deliver" notification respective of the content.

The foregoing and/or exemplary embodiments may be achieved by an apparatus for generating a traffic simulation respective of at least one content storing server. The apparatus may include a first network interface to sniff traffic between at least a first portion of a network and at least a second portion of the network, a storage for storing at least information respective of content received through the first network interface, a second network interface configured to communicate with the at least first portion of the network and the at least second portion of the network, a processing unit; and a memory containing instructions that, when executed by the processing unit, cause the apparatus to: sniff traffic between at least the first portion of the network and at least the second portion of the network; identify from the sniffed traffic at least a source of the content and at least a destination of the content; determine if the content is stored on a cache; simulate a notification respective of the content; and generate a simulation of traffic respective at least of: the content and the simulated notification.

The apparatus may further include a deep-packet-inspection (DPI) unit coupled to the first network interface and configured to identify at least the source of the content respective of the sniffed traffic, the DPI unit further configured to inspect one or more packets provided, through the first network interface, from the identified source of the content, each packet having at least a specific source address and a specific destination address.

The memory may further contain instructions that, when executed by the processing unit, cause the apparatus to: determine, upon determining that the content is not stored on the cache, if the content should be acquired to be stored on the cache.

The memory further contains instructions that, when executed by the processing unit, cause the apparatus to: simulate, upon determining that the content should be acquired, a "store" notification respective of the content.

The memory further contains instructions that, when executed by the processing unit, cause the apparatus to: simulate, upon determining that the content should not be acquired, a "no deliver" notification respective of the content.

The memory further contains instructions that, when executed by the processing unit, cause the apparatus to: determine, upon determining that the content is stored on the cache, if the content can be delivered from the cache.

The memory further contains instructions that, when executed by the processing unit, cause the apparatus to: simulate, upon determining that the content can be delivered from the cache, a "potential delivery" notification respective of the content.

The memory further contains instructions that, when executed by the processing unit, cause the apparatus to: simulate, upon determining that the content cannot be delivered from the cache, a "no deliver" notification respective of the content.

The foregoing and/or other aspects of the exemplary embodiments may be achieved with a non-transitory computer readable storage medium storing a program for executing a method of generating a traffic simulation respective of at least one content storing server, the content storing server operative for caching popular content, the method including sniffing traffic between at least a first portion of a network and at least a second portion of the network, identifying, from the sniffed traffic, at least a source of content and at least a destination of the content, determining if the content is stored on a cache; simulating a notification respective of the content, and generating a simulation of traffic respective at least of: the content and the simulated notification.

BRIEF DESCRIPTION OF THE DRAWINGS

The foregoing and other objects, features, and advantages will become apparent and more readily appreciated from the following detailed description taken in conjunction with the accompanying drawings in which.

DETAILED DESCRIPTION OF EXEMPLARY EMBODIMENTS

Figure 1A:
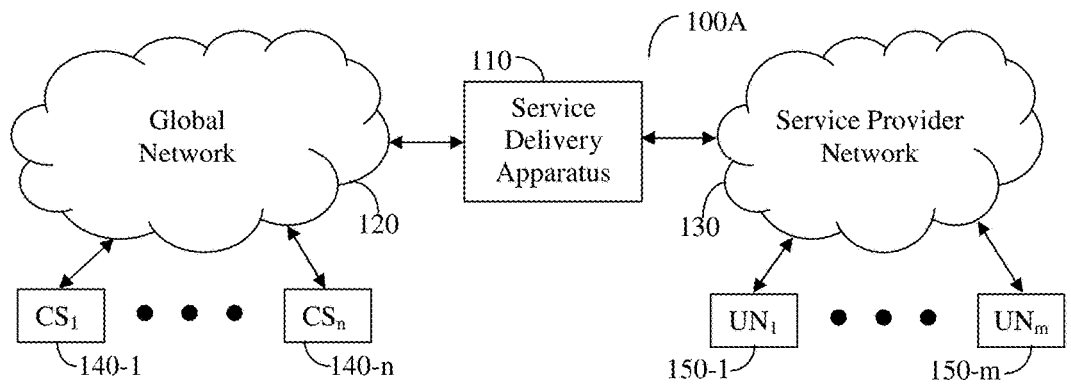
FIG. 1A is a block diagram of a basic network system operating as a bump-in the wire according to an exemplary embodiment.

Below, exemplary embodiments will be described in detail with reference to accompanying drawings so as to be easily realized by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

It is important to note that the embodiments here disclosed are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality.

Disclosed are systems and methods for performing a simulation of efficient usage of a bandwidth of network transferring content, such as video data, when using caching techniques. Packets from content sources are analyzed to identify content sources that provide predetermined types of data. Upon identification of such content sources, any data that arrives from such a content source is subject to a deep-packet-inspection (DPI) process to positively identify the content and determine whether or not to store it in cache storage so that when a subsequent request for the same content is received, there is no need to transmit the content from the content source, since it can simply be delivered from the system's storage. The results include at least less traffic going on the entire network, faster service, and lower operational costs. The simulation provides a prediction of potential effectiveness of the system for a given network and its respective traffic when being used.

Reference is now made to FIG. 1A where an exemplary and non-limiting block diagram 100A of a basic network system according to an exemplary embodiment is shown. The system depicted comprises of a global network 120 and a service provider network 130 that are coupled by a 'bump-in-the-wire' apparatus 110. While the network 120 and 130 are shown as detached from each other it should be noted that this is only an exemplary configuration and other configurations are possible without departing from the principles of the present disclosure. A network may be a Local Area Network (LAN), Wide Area Network (WAN), Metro Area Network (MAN), the World Wide Web (WWW), the Internet, combinations thereof, or the like. To the global network 120 there are connected one or more content sources (CSs), shown as $CS_1$ 140-1 through $CS_n$ 140-n, commonly referred to as CS 140. The content sources provide content, such as video clips, upon request from the appropriate CS to a user. To the service provider network 130 there are connected one or more user nodes (UNs), shown as $UN_1$ 150-1 through $UN_m$ 150-m, commonly referred to as UN 150.

When a UN 150 requests content from a CS 140 it is transferred, according to the exemplary embodiment, through a service delivery apparatus (SDA) 110, the function of which is described in more detail herein below. Generally, the SDA 110 may provide the requested content from its storage or, when such content, or portions thereof, are not in the SDA 110, then the request is forwarded to the appropriate CS 140 for the delivery of the content, as further described below.

Figure 1B:
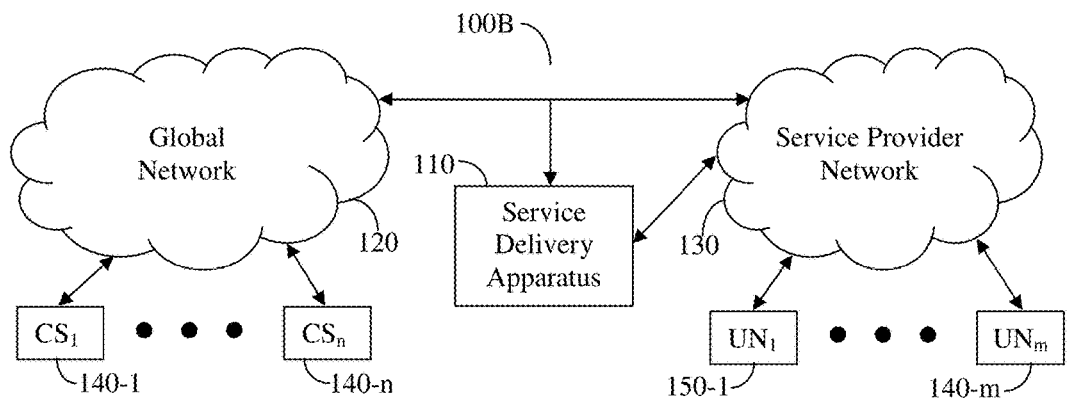
FIG. 1B is a block diagram of a basic network system operating as a sniffer according to an exemplary embodiment.

FIG. 1B depicts an exemplary and non-limiting block diagram 100B of a basic network system operating as a sniffer according to an exemplary embodiment. Operating similarly to the system shown in FIG. 1A, the system 100B has the SDA 110 connected in a sniffer mode, i.e., the SDA merely listens to the traffic moving between the global network 120 and the service provider network 130 without routing packets through itself. When the SDA 110 is connected in sniffer mode it will typically connect to the service provider network 130 through a separate communication port to provide content stored therein to a destination connected to the service provider network 130.

Figure 2:
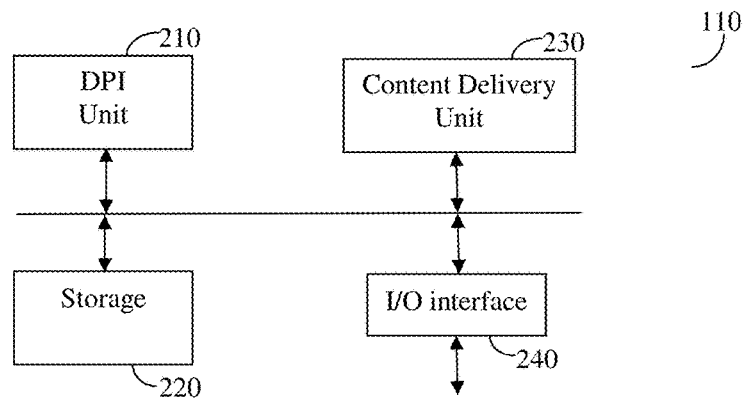
FIG. 2 is a block diagram of an apparatus to identify content sources and provide content from the apparatus according to an exemplary embodiment.

FIG. 2 provides an exemplary and non-limiting block diagram of the SDA 110 that identifies content sources and provides content from the apparatus in accordance with the principles of the present disclosure. The SDA 110 comprises a DPI unit 210, a storage 220, a content delivery unit (CDU) 230 and an input/output interface 240. According to the principles of the present disclosure, the DPI unit 210 has at least two separate tasks. The first task is to identify sources of content that potentially contain data that may be worthwhile to store in storage 220. For example, video servers may be located throughout the global network 120 and randomly accessed by UNs 150 of the service provider network 130. In order to overcome the deficiencies of related art solutions, the SDA 110 is implemented differently.

The DPI unit 210 is provided with data types to look for in data packets that are transmitted through the SDA 110. Instead of inspecting each and every packet, the DPI unit 210 may inspect only one-in-a-thousand packets out of the entire traffic thereby significantly lowering the processing load. It should be understood that the method for selecting the sampled packets is typically not performed by using a simple counter to process one out of every predetermined number of packets. Instead, the source and destination addresses from each packet are fed into a hash function, and the hash function result is compared to a configurable threshold, and the result of this comparison determines if the packet is inspected or not. In addition, it should be understood that the hash function is symmetric with respect to the source and destination addresses, such that swapping the source address and the destination address does not change the hash result.

In one exemplary embodiment, the source and destination ports may also be used as part of the hash function operation. This is needed to guarantee that each flow comprising of multiple packets sent between a UN 150 and a CS 140 is either fully ignored or fully inspected.

Upon determination that a specific CS 140 provides a desired data type, the identification of that CS 140 is stored. Any future packet received from or sent to the identified CS 140 is inspected by the DPI unit 210 and if the packet contains content that may be interesting for storage, such as video content, such content is stored in the storage 220.

This kind of inspection ensures that demand for highly popular content from a popular CS 140 is likely to be quickly detected while infrequent access to a CS 140 would typically not impact the traditional operation of the system. It should be noted that identification of a CS 140 does not have to be on the first detection of data of interest and threshold levels may be used, as well as an aging mechanism so that relatively infrequently accessed CSs 140 would lose older accesses, and those older accesses would therefore not accumulate to reach a threshold value. The threshold may be static, dynamic or adaptive. Static thresholds are predetermined thresholds that remain constant. Dynamic thresholds are forcefully changed, for example, at a certain time of day, or according to information respective of the user. Adaptive thresholds are changed in response to changes in characteristics of the website engagement and may vary depending on a variety of parameters.

While DPI unit 210 operates on the packets that arrive from CSs 140, the CDU 230 operates with respect of requests for content received from the UNs 150 of the service provider network 130. Upon receipt of such a request, the DPI 210 first checks if content from the requested CS 140 actually resides in the storage 220 by first checking that the CS 140 identification is known to the SDA 110. If that is the case, then the storage 220 is checked for the possibility of delivery of the content or portions thereof. If the entire content or portions thereof are found, then these are delivered to the requesting UN 150. If the entire content is missing, or certain portions thereof are missing, then the request is forwarded to the appropriate CS 140. Storage 220 may be semiconductor media, magnetic media, or any other type of storage media appropriate for the storage of content.

Figure 3:
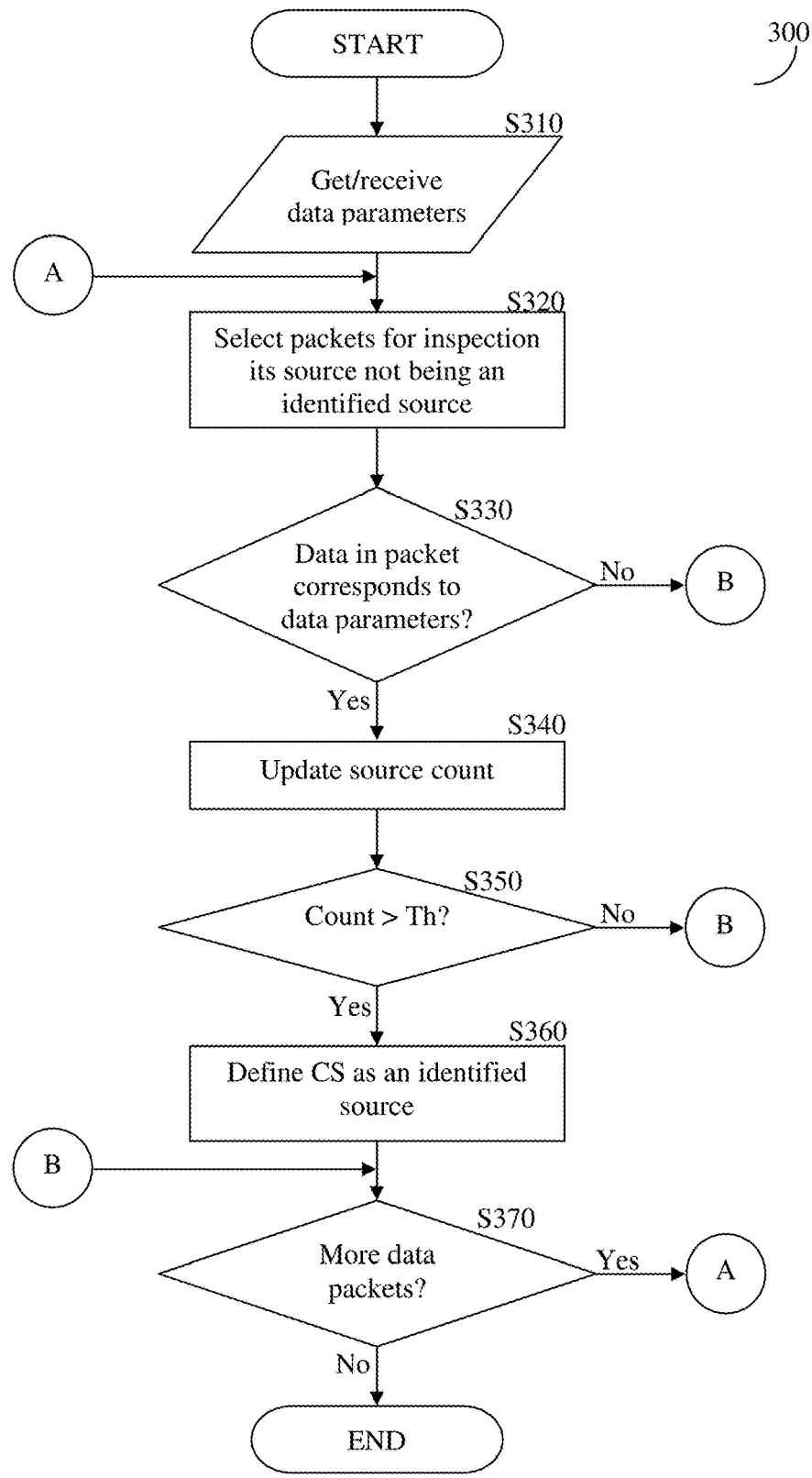
FIG. 3 is a flowchart depicting the identification of a content source according to an exemplary embodiment.

Reference is now made to FIG. 3 that depicts an exemplary and non-limiting flowchart 300 depicting the identification of a content source in accordance with an exemplary embodiment. In S310 there are received and/or fetched parameters relating to the data of interest in the CSs. For example, the parameters may include parameters pertaining to video data. In S320, packets are selected off of the network traffic, for example the global network 120. The ratio between the number of packets that pass through the network and the number inspected may be configured, so it could be one-in-a-thousand, one-in-ten-thousand, and so on and so forth.

In S330, it is checked if the data in the packet corresponds to the data parameters, e.g., contains video data, and if so, execution continues with S340; otherwise, execution continues with S370. In S340, the count respect of the CS 140 that is the source of the packet is updated, for example but not by way of limitation, by incrementing the value of a counter. In S350, it is checked if the count for that CS 140 has exceeded a threshold value and if so execution continues with S360; otherwise, execution continues with S370. In one exemplary embodiment, the count may also have an aging mechanism as described previously (not shown). Furthermore, different data types may have different thresholds, different count increases, and different count aging. In S360, the CS 140 is identified as a source of content eligible for storage in a storage unit, for example, storage 220. In S370, it is checked if there are more data packets to be inspected and if so execution continues with S320; otherwise execution terminates.

Figure 4:
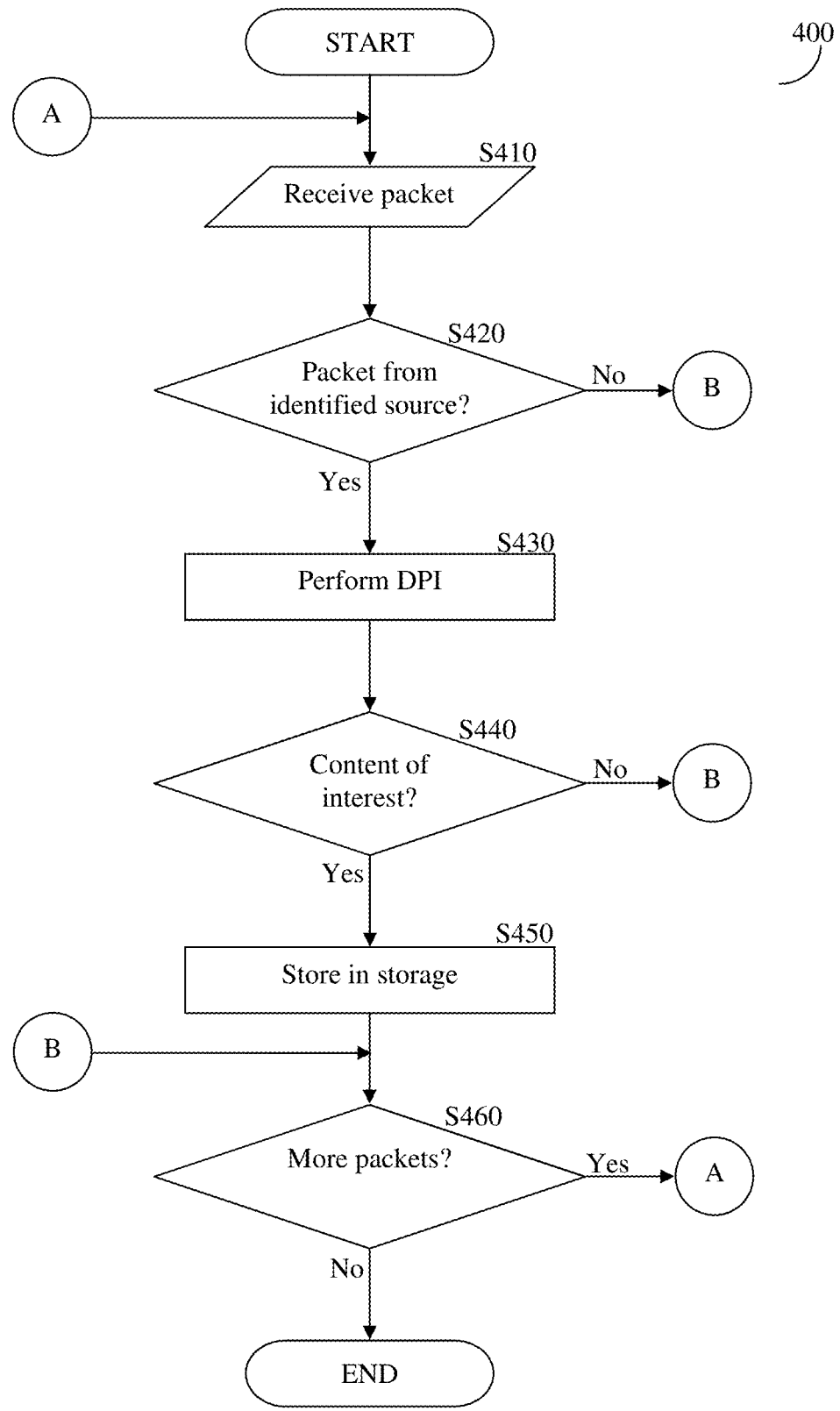
FIG. 4 is a flowchart depicting the storage of content from identified content sources in the storage of the apparatus according to an exemplary embodiment.

Reference is now made to FIG. 4 that depicts an exemplary and non-limiting flowchart 400 depicting the storage of content, from the identified CS 140, in the storage 220 of the SDA 110 according to the exemplary embodiment. In S410 a packet is received by SDA 110. In S420, it is checked whether the received packet is from an identified CS 140 and if so execution continues with S430; otherwise execution continues with S460. In S430, the received packet is inspected by the DPI unit 210 to possibly identify content of interest. It should be understood that this takes place as it is possible that even though the packet arrived from an identified CS 140 it does not contain content of interest and therefore there is no need to waste valuable storage space in storage 220 for that data.

In S440, it is checked whether such content of interest was found and if so execution continues with S450; otherwise, execution continues with S460. In S450, the content from the received packet is stored in storage, for example, storage 220. In S460, it is checked whether more packets are received and if so execution continues with S410; otherwise, execution terminates.

Figure 5:
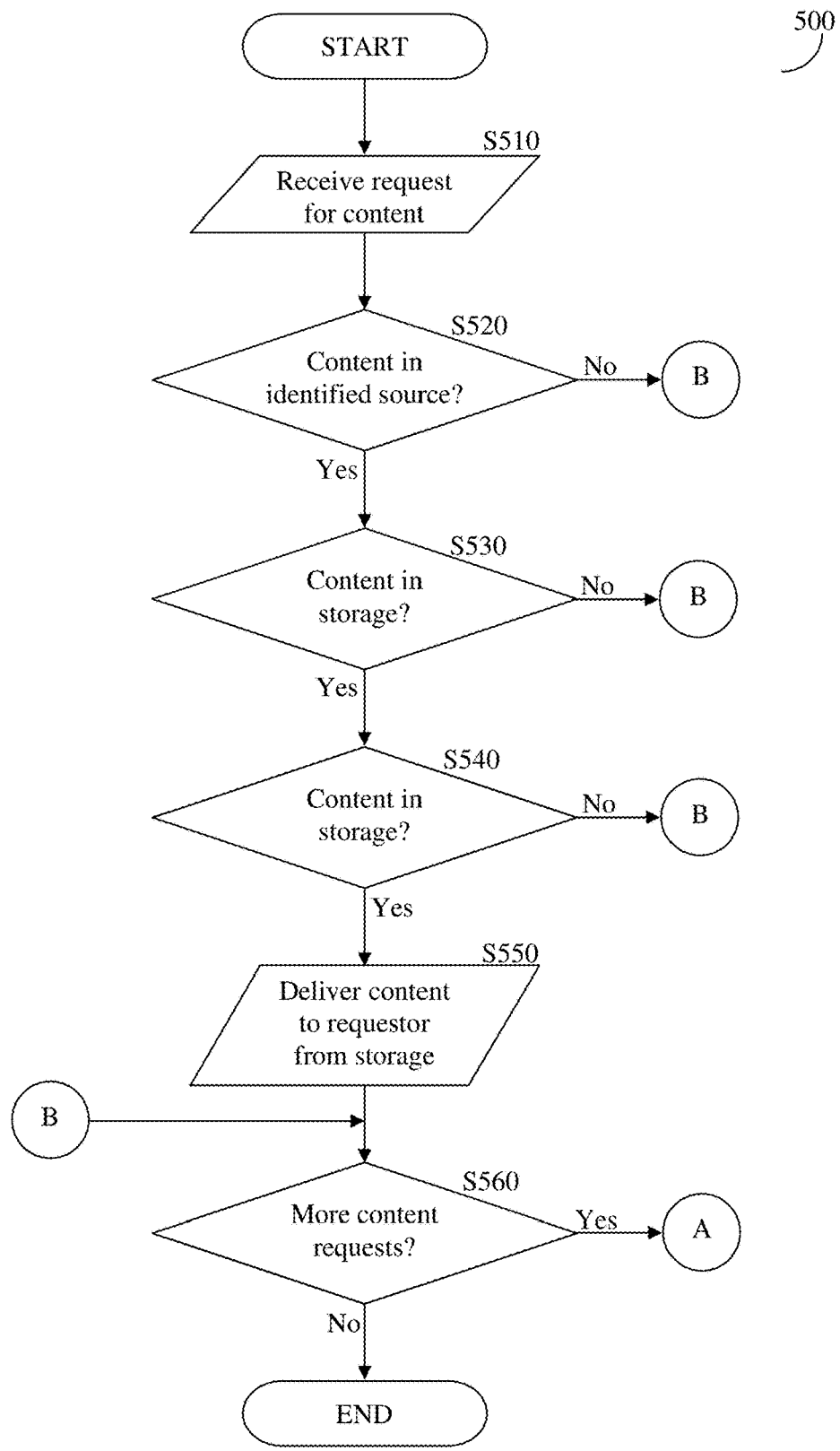
FIG. 5 is a flowchart describing the providing of content to a requesting node according to an exemplary embodiment.

Reference is now made to FIG. 5 that depicts an exemplary and non-limiting flowchart 500 describing the providing of content to a requesting UN 150 according to the principles of the exemplary embodiment. In S510, the SDA 110 receives a request for content from a UN 150. In S520, it is checked if the requested content is in an identified CS 140 and if so execution continues with S530; otherwise, execution continues with S560.

In S530, it is checked whether the requested content is in storage, for example storage 220, and if so execution continues with S540; otherwise, execution continues with S560. In S540, it is checked whether the whole content is in storage and if so execution continues from S550; otherwise, execution continues with S560. The need to check storage twice (i.e., in operations S530 and S540) arises because the requested content is not the same as the whole content. In a video file, for example, the file is broken up into smaller pieces. In this exemplary embodiment, the requested content would be one of the smaller pieces, while the whole content would be the entire video file.

In S550, the content is delivered to the requesting UN 150. In S560, it is checked whether additional content requests exist and if so execution continues with S510; and if not, execution terminates.

In one exemplary embodiment, when detecting that a portion of the requested content is in the storage 220 and deliverable to the requesting UN 150, such content is delivered immediately to the UN 150 while only the missing portions of the content is requested from the CS 140. Hence a request from the CDU 230 may be for the requested content or portions thereof. It should be further understood that in an exemplary embodiment, once the DPI unit 210 determines that a CS 140 may contain content that should be stored in storage 220, the packets from such a CS 140 are consistently inspected for determination of popular content.

Figure 6:
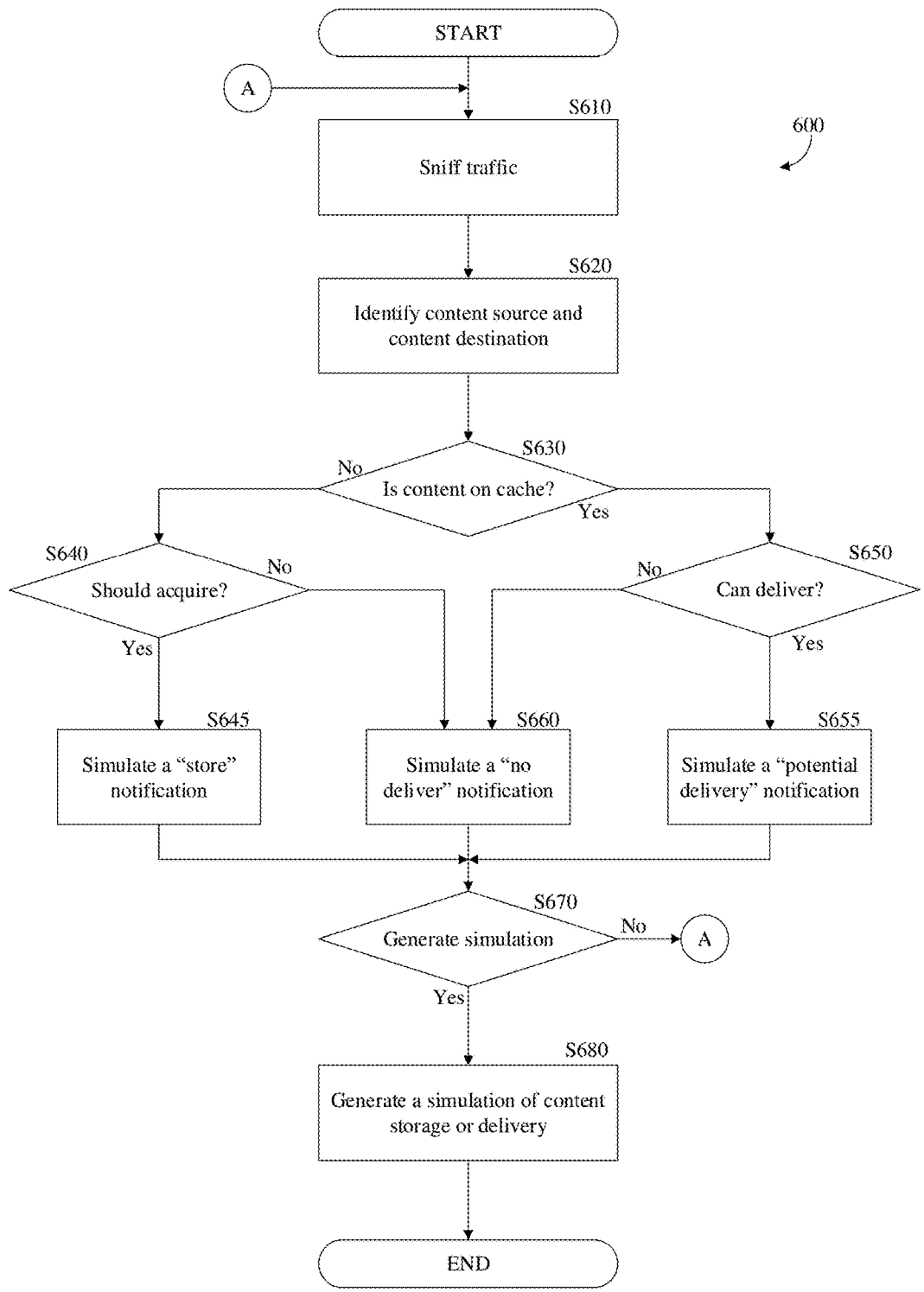
FIG. 6 is a flowchart of a method for performing analytics with respect to content storing servers caching popular content according to an exemplary embodiment.

FIG. 6 is a non-limiting exemplary flowchart 600 of a method for performing analytics with respect to content storing servers caching popular content according to an exemplary embodiment. In S610, sniffing traffic between at least a first portion of a network and at least a second portion of a network is performed in order to identify content. FIG. 1B is a non-limiting example for a basic network system operating as a sniffer. Sniffing may be performed, for example, by SDA 110.

In S620 a content source and a content destination are identified, respective of the sniffed traffic. Further information may be identified, such as type of content, size of content, time stamps and the like. In S630 a check is performed to determine if the identified content is in a cache of an apparatus, such as SDA 110. If the content is in a cache, execution continues at S650, otherwise execution continues at S640.

In S640, a check is performed to determine if the content should be acquired. If the content should be acquired, execution continues at S645, otherwise execution continues at S660. In S645, a "store" notification is simulated, indicating that the identified content should be stored in a cache. The notification may be stored in a memory and used to generate a simulation.

In S650, a check is performed to determine if the identified content can be delivered from the cache. An example of when content might be stored in the cache but cannot be delivered would be if there are copyright issues. For instance, if the content stored in the cache is licensed for viewing only within one country, the content cannot be delivered if the UN 150 is in another country. If the content can be delivered from the cache, execution continues at S655, otherwise execution continues at S660. In S655, a "potential delivery" notification is simulated, indicating that content stored in a cache may be delivered. The notification may be stored in a memory and used to generate a simulation.

In S660, a "no deliver" notification is simulated, indicating that the identified content cannot be delivered. The notification may be stored in a memory and used to generate a simulation. In certain exemplary embodiments, a further check may be performed to determine if content which cannot be delivered should be deleted from the cache.

Figure 9:
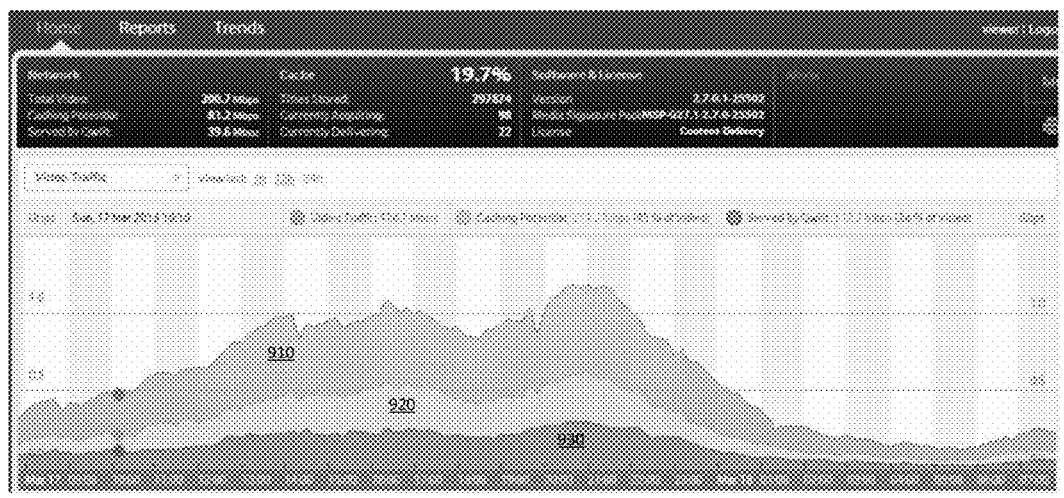
FIG. 9 is another graph of network traffic for an exemplary network.

A check is performed in S670 to determine if the results of the simulation should be generated. For example, it may not be desirable to generate a simulation if a sufficient amount of data points have not yet been collected. If it is determined that the results of the simulation should be generated, execution continues at S680, otherwise execution continues at S610. In S680, the results of the simulation are generated, respective of at least one simulated notification of any of S645, S655 or S660, perhaps in the form of a graph as shown in FIG. 9. The results of the generated simulation may be stored in a memory.

In certain embodiments, actual notifications respective of S645, S655, and S660, or combination of actual and simulated notifications may be used to generate the results of the simulation. An actual notification is generated by the SDA 110 during its course of run. A simulated notification is generated during a "what-if" scenario. For example, if a lower threshold by which acquisition decisions are made is simulated (to acquire more content), additional notifications would be created.

In an embodiment, the results of the simulation may be an illustration of the network operating with the SDA 110 described in more detail herein, and may also include a comparison to the same network operating without the SDA 110 present. The results of the simulation may be generated in real-time or at a later time using notifications stored as information in a memory. The results of the simulation may further be respective of limitations of the SDA 110, such as the physical size of the cache. In such an exemplary embodiment, the results of the simulation may be generated by simulating any cache size to determine the content which would be available for delivery, and actual notifications would correspond to the actual cache size while simulated notifications would correspond to the simulated cache size.

This allows for more efficient use of resources, since a larger (and therefore costlier) cache size would not necessarily result in more content being delivered. By simulating different cache sizes, it is possible to find an optimal cache size for the content storing server. The method shown herein may be performed by the SDA 110 itself, being appropriately configured, or otherwise, by a simulator device having access to data from the SDA 110 via its network connectivity interfaces.

Figure 7:
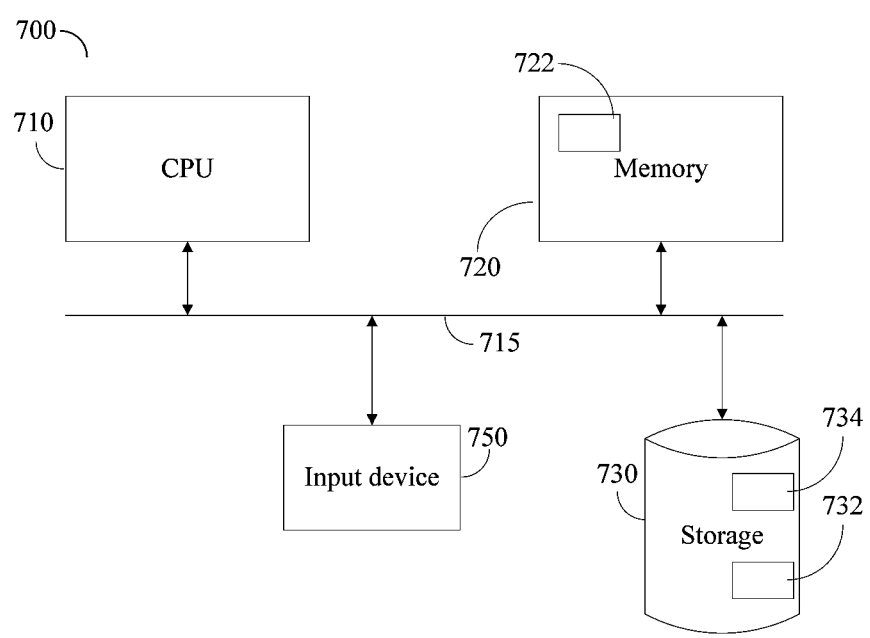
FIG. 7 is a schematic illustration of a server implemented according to an exemplary embodiment.

FIG. 7 depicts an exemplary and non-limiting schematic illustration of server 700, implemented according to an exemplary embodiment. In one embodiment the server 700 is communicatively connected to the SDA 110 (not shown) for collecting the information therefrom. In an exemplary embodiment, the server 700 is connected like the sniffer mode of the SDA 110 as shown in FIG. 1B, for the purpose of collecting the desired information. The server 700 comprises at least a processing element 710, for example, a central processing unit (CPU) that is coupled via a bus 715 to a memory 720. The memory 720 further comprises a memory portion 722 that contains instructions that when executed by the processing element 710 performs the method described in more detail herein. The memory may be further used as a working scratch pad for the processing element 710, a temporary storage, and others, as the case may be. The memory may comprise of volatile memory such as, but not limited to, random access memory (RAM), or non-volatile memory (NVM), such as, but not limited to, flash memory.

The processing element 710 may be coupled to an input device 750, e.g., a mouse and/or a keyboard, and a data storage 730. Data storage 730 may be used for the purpose of holding a copy of the method executed according to the disclosed technique in FIG. 6. Data storage 730 may further comprise storage portion 732 containing information respective of at least a content packet. The information may include source, destination, packet size and the like. Data storage 430 may further comprise storage portion 434 containing at least the results of the simulation generated respective of the information.

Figure 8:
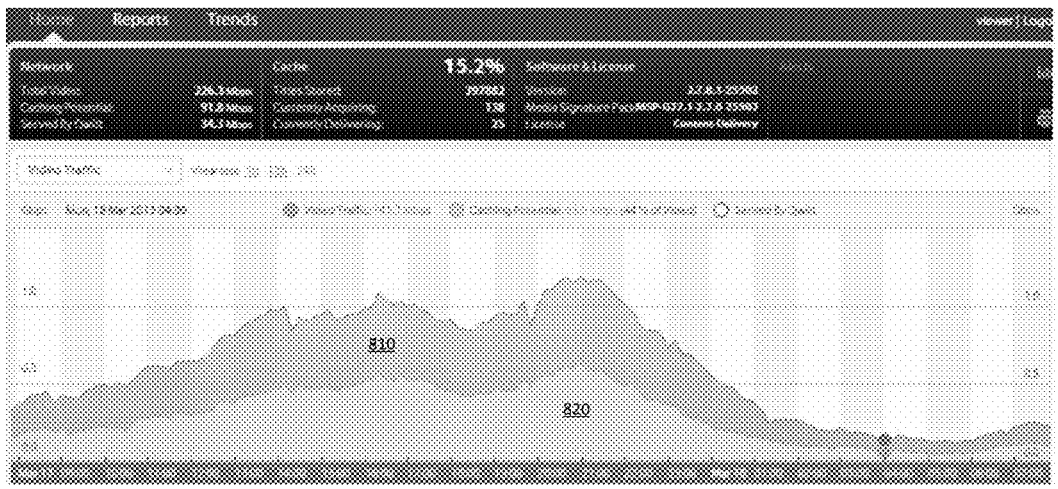
FIG. 8 is a graph of network traffic for an exemplary network.

Reference is now made to FIGS. 8 and 9, which are non-limiting exemplary graphs of network traffic for exemplary networks.

FIG. 8 is a plot of actual network traffic in Gigabits per second (Gbps) as a function of time. A first graph area 810 indicates the total amount of video traffic for the given network. A second graph area 820 indicates the total amount of video traffic determined by a system, for example server 700, to be potentially stored and delivered by a cache.

FIG. 9 is another plot of network traffic in Gigabits per second (Gbps) as a function of time. A first graph area 910 indicates the total amount of video traffic for the given network. A third graph area 930 indicates the amount of data which is delivered by a cache. The first graph area 910 and the third graph area 930 together comprise information. The information is used, for example by a server 700 implementing the method of FIG. 6 to generate a simulation of a network operating with the apparatus described in more detail herein. The results of the generated simulation are represented by a second graph area 920, which indicates the amount of additional traffic which may be stored and delivered by a cache.

The relationship between FIGS. 8 and 9 can be explained as follows. Graph area 810 corresponds to area 910, and area 820 corresponds to area 920. Area 810 is the total amount of video traffic which the SDA has access to. Area 820 is the total amount of video which is eligible for caching (according to thresholds, etc.). Area 930 is what can be delivered by the SDA. For example, in FIG. 9, if the cache size is increased, more content would not necessarily be delivered from the cache, as what is delivered has a smaller area than what is cache-eligible.

The principles of the disclosure are implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

All examples and conditional language recited herein are intended for pedagogical purposes to aid the reader in understanding the principles of the present disclosure and the concepts contributed by the inventor to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A network traffic simulation tool for at least one content storing server, comprising:
    a first network interface to sniff traffic between at least a first portion of a network and at least a second portion of the network;
    a storage for storing at least information for content received through the first network interface;
    a second network interface configured to communicate with the at least first portion of the network and the at least second portion of the network;
    a processing unit; and
    a memory containing instructions that, when executed by the processing unit, cause the apparatus to:
        sniff traffic between at least the first portion of the network and at least the second portion of the network, wherein the sniffing listens to the traffic moving between the at least the first portion of the network and the at least the second portion of the network while the sniffed traffic passes directly between the at least the first portion of the network and the at least the second portion of the traffic;
        identify from the sniffed traffic at least a source of the content and at least a destination of the content;
        when the content is stored in a cache:
        simulate a notification for the content; and
        generate a simulation of traffic for at least: the content and the simulated notification.

2. The network traffic simulation tool of claim 1, further comprising:
    a deep-packet-inspection (DPI) unit coupled to the first network interface and configured to identify at least the source of the content for the sniffed traffic, the DPI unit further configured to inspect one or more packets provided, through the first network interface, from the identified source of the content, each packet having at least a specific source address and a specific destination address.

3. The network traffic simulation tool of claim 1, wherein the memory further contains instructions that, when executed by the processing unit, cause the apparatus to: determine, upon determining that the content is not stored in the cache, if the content should be stored on the cache.

4. The network traffic simulation tool of claim 3, wherein the memory further contains instructions that, when executed by the processing unit, cause the apparatus to: simulate, upon determining that the content should be stored, a "store" notification for the content.

5. The network traffic simulation tool of claim 3, wherein the memory further contains instructions that, when executed by the processing unit, cause the apparatus to: simulate, upon determining that the content should not be acquired, a "no deliver" notification for the content.

6. The network traffic simulation tool of claim 1, wherein the memory further contains instructions that, when executed by the processing unit, cause the apparatus to: determine, upon determining that the content is stored in the cache, if the content can be delivered from the cache.

7. The network traffic simulation tool of claim 6, wherein the memory further contains instructions that, when executed by the processing unit, cause the apparatus to: simulate, upon determining that the content can be delivered from the cache, a "potential delivery" notification for the content.

8. The network traffic simulation tool of claim 6, wherein the memory further contains instructions that, when executed by the processing unit, cause the apparatus to: simulate, upon determining that the content cannot be delivered from the cache, a "no deliver" notification for the content.

* * * * *